(12) United States Patent
Pearson et al.

(10) Patent No.: US 7,036,217 B2
(45) Date of Patent: May 2, 2006

(54) METHODS OF MANUFACTURING VIA INTERSECT PAD FOR ELECTRONIC COMPONENTS

(75) Inventors: Tom E. Pearson, Beaverton, OR (US); Carolyn R. McCormick, Hillsboro, OR (US); Jayne L. Mershon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 321 days.

(21) Appl. No.: 10/348,159

(22) Filed: Jan. 21, 2003

(65) Prior Publication Data

US 2003/0101585 A1    Jun. 5, 2003

Related U.S. Application Data

(62) Division of application No. 09/887,597, filed on Jun. 22, 2001, now Pat. No. 6,509,530.

(51) Int. Cl.
*H05K 3/34* (2006.01)
(52) U.S. Cl. ............ 29/840; 29/832; 228/180.1; 228/180.21; 228/180.22
(58) Field of Classification Search ................ 29/832, 29/840, 852; 228/180.1, 180.21, 180.22
See application file for complete search history.

(56) References Cited

U.S. PATENT DOCUMENTS

| | | | |
|---|---|---|---|
| 3,566,005 A | 2/1971 | Shaheen | 174/68.5 |
| 5,311,405 A | 5/1994 | Tribbey et al. | 361/767 |
| 5,414,222 A | 5/1995 | Sen et al. | 174/262 |
| 5,453,581 A | 9/1995 | Liebman et al. | 174/261 |
| 5,683,788 A | 11/1997 | Dugan et al. | 428/209 |
| 5,706,178 A | 1/1998 | Barrow | 361/777 |
| 5,875,102 A | 2/1999 | Barrow | 361/777 |
| 6,091,155 A | 7/2000 | Jonaidi | 257/786 |
| 6,115,262 A | 9/2000 | Brunner et al. | 361/774 |
| 6,168,854 B1 | 1/2001 | Gibbs | 428/209 |
| 6,169,253 B1 | 1/2001 | Jairazbhoy et al. | 174/250 |
| 6,192,580 B1 | 2/2001 | Hayami | 29/846 |
| 6,288,906 B1 | 9/2001 | Sprietsma et al. | 361/772 |
| 6,346,679 B1 | 2/2002 | Nakamura | 174/260 |
| 6,566,611 B1 | 5/2003 | Kochanowski et al. | |

FOREIGN PATENT DOCUMENTS

| | | | |
|---|---|---|---|
| EP | 0971569 | | 1/2000 |
| JP | 06-061609 | * | 3/1994 |
| WO | WO-95/19691 | | 7/1995 |

* cited by examiner

*Primary Examiner*—Carl J. Arbes
(74) *Attorney, Agent, or Firm*—Schwegman, Lundberg, Woessner & Kluth, P.A.

(57) ABSTRACT

According to a method of mounting electronic components on a printed circuit board (PCB), the electrical contacts of the components are coupled to PCB bonding pads that are intersected by via pads. To minimize various defects encountered during solder reflow, while concurrently minimizing PCB area and manufacturing costs, the via pads are formed so that the via holes substantially avoid underlying the solder fillets coupling the component contacts to the PCB bonding pads. In one embodiment, the via pads are formed in the inter-pad space beneath the component; in another embodiment they are offset from the bonding pads. A substrate, an electronic assembly, and an electronic system are also described.

27 Claims, 4 Drawing Sheets

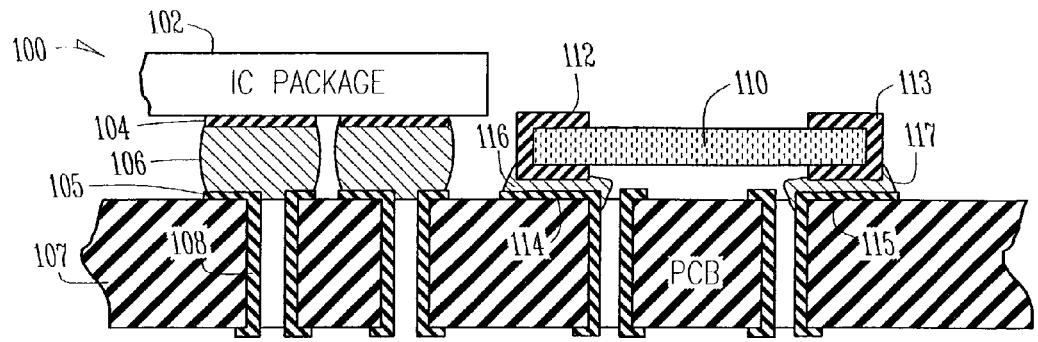
Fig. 11
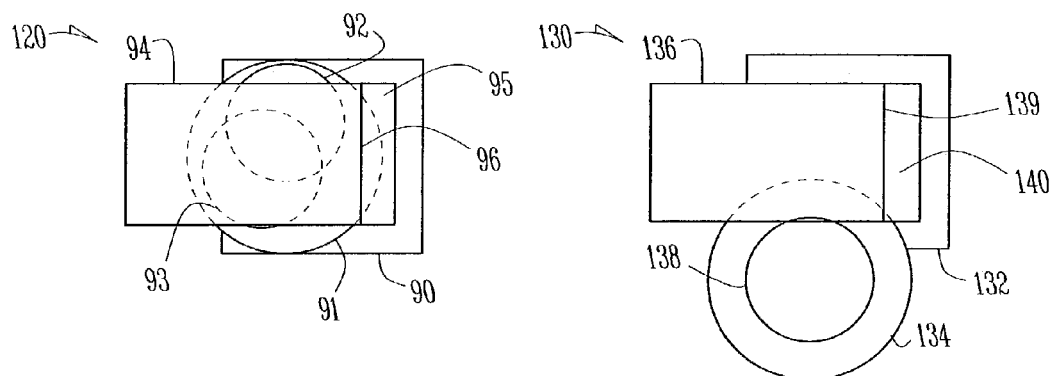
Fig. 12
Fig. 13
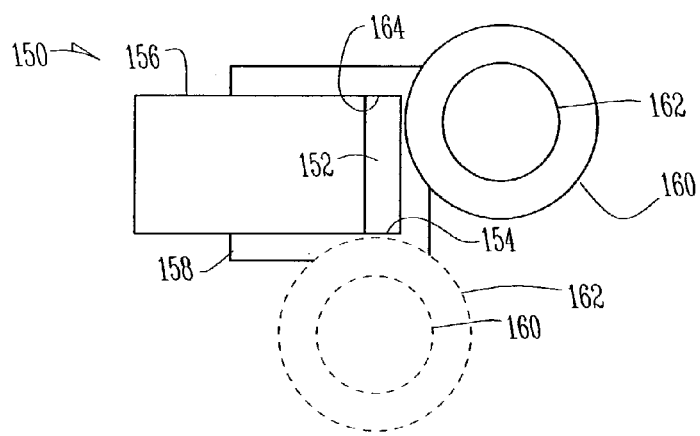
Fig. 14

METHODS OF MANUFACTURING VIA INTERSECT PAD FOR ELECTRONIC COMPONENTS

RELATED APPLICATIONS

This application is a divisional of application U.S. Ser. No. 09/887,597 filed on Jun. 22, 2001, now issued as U.S. Pat. No. 6,509,530.

TECHNICAL FIELD

The present subject matter relates generally to electronics packaging. More particularly, the present subject matter relates to apparatus and methods for mounting electrical components to bonding pads having vias.

BACKGROUND INFORMATION

"Electronic components", such as integrated circuits (ICs), discrete components, and passive components, can be physically and electrically coupled to a substrate such as a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktops, laptops, hand-helds, servers, Web appliances, routers, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, camcorders, digital cameras, etc.), and the like.

In the field of electronic systems there is an incessant competitive pressure among manufacturers to drive the performance of their equipment up while driving down production costs. This is particularly true regarding the packaging of electronic components on substrates, where each new generation of board-level packaging must provide increased performance while generally being smaller or more compact in size.

A substrate typically includes a number of insulation and metal layers selectively patterned to provide metal interconnect lines (referred to herein as "traces"), and a plurality of electronic components mounted on one or more surfaces of the substrate and functionally interconnected through the traces. The routing traces typically carry signals that are transmitted among the electronic components of the system. Some ICs have a relatively large number of input/output (I/O) pads. The large number of I/O pads requires a relatively large number of routing traces. Some PCBs require multiple layers of routing traces to accommodate all of the system interconnections.

Routing traces located within different layers are typically connected electrically by vias formed in the substrate. A via can be made by first forming vertically-aligned via pads in some or all layers of a PCB as it is being built up, forming a hole through the via pads, and then coating or plating the interior hole surface with an electrically conductive material, such as copper, silver, or gold.

One of the conventional ways of mounting components on a substrate is called surface mount technology (SMT). SMT components have terminations or leads (generally referred to as "electrical contacts", "bumps", or "pads") that are soldered directly to the surface of the substrate. SMT components are widely used because of their compact size and simplicity of mounting. One conventional type of SMT component utilizes a ball grid array (BGA) to connect to the substrate. A BGA component has on one of its surfaces a plurality of solder balls, one ball per pad.

The electrical contacts of an SMT component are coupled to corresponding electrically conductive mounting or bonding pads (also referred to herein as "lands") on the surface of the substrate, in order to establish secure physical and electrical connections between the component and the substrate. Ordinarily one land is dedicated to one SMT electrical contact. However, if the land needs to be connected to a trace on a different layer, it is necessary to additionally provide a via pad that is located adjacent the land and connected to the land through a trace on the same layer. This in effect can increase the PCB real estate consumed by lands and associated via pads by up to a factor of 2.

In order to fabricate PCBs in which components are mounted in higher densities, it is known to use a via-in-pad (VIP) structure. In this structure, a via is formed substantially completely within each mounting pad or land, thus conserving valuable "real estate" on the PCB that would otherwise be separately occupied by the vias and the lands. The resulting electronic system can be manufactured at a lower cost and in a more compact size, and it is therefore more commercially attractive.

Before the SMT component is mounted on a substrate, the substrate lands are selectively coated with solder paste. To mount an SMT component to a substrate, the component is carefully positioned or "registered" over the substrate so that its electrical terminals or contacts are aligned with the corresponding lands. Finally, in an operation known as "solder reflow", the component terminals and the PCB lands are heated to a temperature that melts the solder paste, so that the terminals and lands make proper electrical and physical connections.

As will be discussed in greater detail below, mounting electronic components on currently used VIP structures can result in significant manufacturing defects.

For the reasons stated above, and for other reasons stated below which will become apparent to those skilled in the art upon reading and understanding the present specification, there is a significant need in the art for apparatus and methods for mounting components to a substrate that offer relatively high density and high quality interconnections at a reasonable production cost.

BRIEF DESCRIPTION OF THE DRAWINGS

FIG. 11 shows a sectional view of an electronic assembly including an IC package coupled to a substrate, and additionally shows a sectional view of a component coupled to a component-mounting region, in accordance with an embodiment of the subject matter;

FIG. 12 shows a diagrammatic top view of a component-mounting region of a substrate, including a portion of a component coupled to a bonding pad of the component-mounting region, and additionally illustrates how a via hole can be positioned at alternative locations within the via pad, in accordance with embodiments of the subject matter;

FIG. 13 shows a diagrammatic top view of a component-mounting region of a substrate, including a portion of a component coupled to the bonding pad of the component-mounting region, and additionally illustrates how a via pad can be positioned at an alternative in-board location while still intersecting with the bonding pad, in accordance with an embodiment of the subject matter;

FIG. 14 shows a diagrammatic top view of a component-mounting region of a substrate, including a portion of a component coupled to the bonding pad of the component-mounting region, and additionally illustrates how a via pad can be positioned at alternative locations while still intersecting with the bonding pad, in accordance with other embodiments of the subject matter.

DETAILED DESCRIPTION

In the following detailed description of embodiments of the subject matter, reference is made to the accompanying drawings that form a part hereof, and in which is shown by way of illustration specific preferred embodiments in which the subject matter may be practiced. These embodiments are described in sufficient detail to enable those skilled in the art to practice them, and it is to be understood that other embodiments may be utilized and that compositional, procedural, mechanical, and electrical changes may be made without departing from the spirit and scope of the present disclosure. The following detailed description is, therefore, not to be taken in a limiting sense, and the scope of embodiments of the present subject matter is defined only by the appended claims.

Embodiments of the present subject matter provide a solution to the problem of solder reflow defects occurring when electronic components are mounted on via-in-pad (VIP) structures. In the present subject matter via pads are formed so as to intersect with their associated bonding pads, to provide what is referred to herein as a via-intersect-pad (V-Int-Pad) structure. Various embodiments are illustrated and described herein. In one embodiment, the via pads are located in the inter-pad region underneath the component, "in-board" of their respective, intersecting bonding pads. This geometry substantially avoids placing the via holes where the component contacts need to mount to the bonding pads. As a result, several types of manufacturing defects are avoided. The PCB real estate is kept to a minimum, as are PCB fabrication costs. Methods of fabrication, as well as application of the subject matter to a substrate, an electronic assembly, and an electronic system, are also described.

In addition to the foregoing advantages, the V-Int-P apparatus and methods of the present subject matter are compatible with existing packaging technologies, so that significant quality improvements are achieved at a relatively low implementation cost, thus making the apparatus and methods of the present subject matter commercially competitive.

Figure 1:
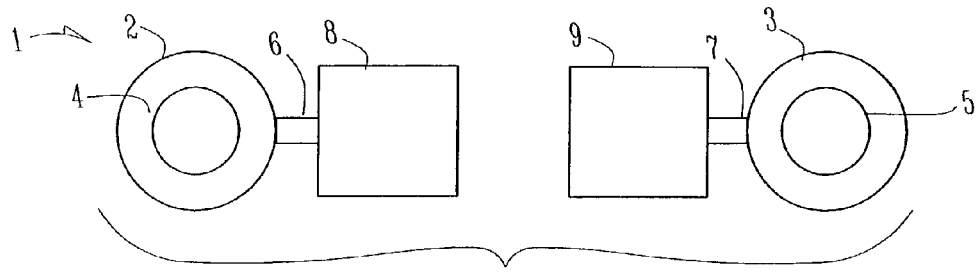
FIG. 1 is a top view of a prior art component-mounting region on a substrate.

FIG. 1 is a top view of a prior art component-mounting region 1 on a substrate (not shown). Component-mounting region 1 is used to mount electronic components, which in one embodiment include small passive devices such as resistors, capacitors, and inductors, to the substrate. Component-mounting region 1 includes a pair of component bonding pads (also referred to herein as "lands") 8 and 9, a pair of via pads 2 and 3, and a pair of traces 6 and 7 to respectively couple each bonding pad 8 and 9 to its associated via pad 2 and 3, respectively.

In the IC packaging technology vias can be either solid or hollow. Although hollow vias are illustrated herein, embodiments of the subject matter can also be implemented with solid vias, or by a combination of hollow and solid vias. Via pads 2 and 3 each have a respective via channel or hole 4 and 5. Vias 2 and 3 comprise electrically conductive material, such as copper, that electrically connects circuit traces on different layers (not shown) of a substrate, such as a printed circuit board ("PCB"). Via pads 2 and 3 can be of any type or cross-section but are typically circular.

In the prior art structure illustrated in FIG. 1, via channels 4 and 5 are essentially copper or copper-plated cylinders, each having a wall of finite, substantially uniform thickness that extends partially into the PCB or entirely through PCB, depending upon how many layers of the PCB it is required to connect to. Via channels 4 and 5 are typically formed by drilling a hole through corresponding via pads 2 and 3, through all or a part of the PCB, and then covering the interior wall of the hole with a conductive metal such as copper, silver, or gold.

Figure 2:
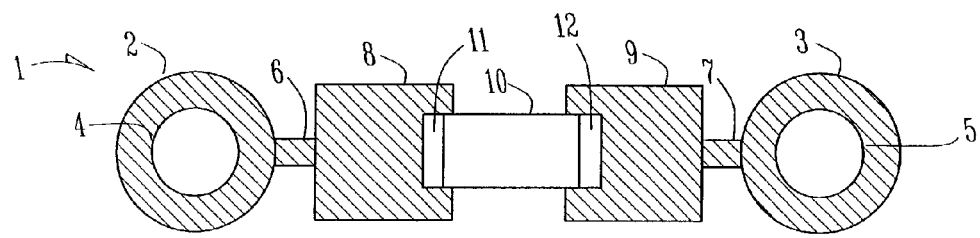
FIG. 2 is a top view of the prior art component-mounting region of FIG. 1 and additionally shows a component mounted to the prior art component-mounting region.

FIG. 2 is a top view of the prior art component-mounting region 1 of FIG. 1 and additionally shows a component 10 mounted to the prior art component-mounting region 1. Component 10 has a pair of terminals 11 and 12, each of which is coupled, e.g. by soldering, to a respective land 8 or 9. In FIG. 2, each of the exposed surfaces of the various elements of the component-mounting region 1 is illustrated as coated with an electrically conductive adhesive such as solder, as indicated by cross-hatching. Terminal 11 of component 10 is illustrated as mounted to land 8, and terminal 12 is mounted to land 9.

In the component-mounting region 1 shown in FIG. 2, via pads 2 and 3 are located out-board of lands 8 and 9, with respect to the mounted component 10. When this layout of component-mounting regions is proliferated over a large area of a PCB, it uses up a substantial amount of PCB area, thus increasing the size, complexity, and cost of the PCB, while decreasing the reliability and electrical performance of the PCB.

Figure 3:
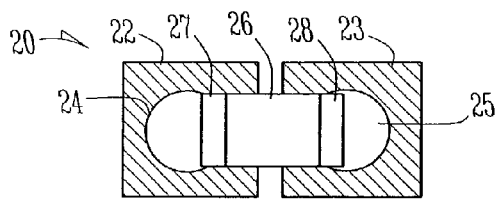
FIG. 3 shows a top view of a different type of prior art component-mounting region on a substrate and additionally shows a component mounted to the prior art component-mounting region.

FIG. 3 shows a top view of a different type of prior art component-mounting region 20 on a substrate and additionally shows a component 26 mounted to the prior art component-mounting region 20. Component-mounting region 20 includes a pair of component bonding pads 22 and 23, each of which has a respective via 24 and 25. Component 26 has a pair of terminals 27 and 28 coupled to bonding pads 22 and 23, respectively.

Via holes 24 and 25 can be of smaller diameter than vias 4 and 5 of the prior art component-mounting region 1 illustrated in FIGS. 1 and 2. However, via holes 24 and 25 are actually relatively large compared with the dimensions of bonding pads 22 and 23. If relatively large diameter via holes 4 and 5 are used, several types of defects can result, as will now be described with regard to FIGS. 3–6.

Figure 4:
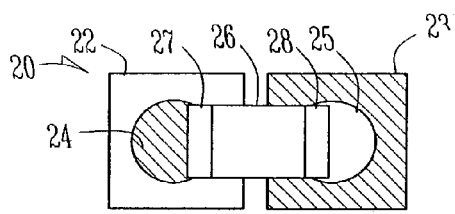
FIG. 4 shows a top view of the prior art component-mounting region of FIG. 3 to illustrate a first type of defect.

FIG. 4 shows a top view of the prior art component-mounting region 20 of FIG. 3 to illustrate a first type of defect. As component sizes become increasingly smaller in physical size, their bonding pads likewise decrease in size. As the size of bonding pads decreases, the via diameter should also scale downward. However, as the via diameter decreases, the cost of drilling or otherwise forming the vias increases significantly. Smaller diameter drills tend to wear out fast and/or break frequently. Also, it is difficult if not prohibitive to drill two or more PCBs simultaneously using small diameter drills, thus further increasing the cost of forming small diameter vias. As a result, board manufacturers and board purchasers have resisted the use of small diameter vias, e.g. those having a diameter less than approximately 0.254 millimeters (10 mil).

As a result, the aspect ratio between the via diameter and the component bonding pad size has increased significantly, i.e. the relative size of the via has significantly increased relative to the bonding pad dimension (and the corresponding component terminal dimension) to the point where the via hole can be 50–70% of the bonding pad area. Because of this, various manufacturing quality issues result, such as insufficient solder joints or mis-orientation of the component relative to the component-mounting area.

For example, FIG. 4 illustrates an example of a defect resulting from insufficiency of solder on bonding pad 22. Because of the relatively large size of via 24, most if not all of the solder that should form a fillet residing on the bonding pad 22 at the solder junction of the component terminal 27 and bonding pad 22 has flowed down into via 24 during the solder reflow operation, leaving an insufficient solder fillet to properly bond terminal 27 of component 26 to bonding pad 22. This quality defect is referred to as a "puddle" effect, because the reflowed solder is lower than the surrounding bonding pad 22. This effect can occur even though via capping material or via plug material has been provided in the vias.

Figure 5:
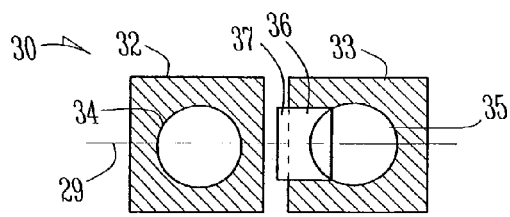
FIG. 5 shows a top view of a prior art component-mounting region similar to or identical to component-mounting region of FIG. 3 and illustrating a second type of defect.

FIG. 5 shows a modified top view of a prior art component-mounting region 30 similar to or identical to component-mounting region 20 of FIG. 3 and illustrating a second type of defect. FIG. 5 should be viewed in conjunction with FIG. 6, which shows a cross-sectional view of the prior art component-mounting region 30 of FIG. 5, taken along line 29 of FIG. 5.

In this example, component 36, whose terminals 37 and 38 were attempted to be coupled to bonding pads 32 and 33 (having vias 34 and 35, respectively, in PCB 45), has become mis-oriented in a so-called "tombstone" effect. Tomb-stoning occurs when solder surface tension during solder reflow differs significantly from one bonding pad to the other, causing the component to move with the pad that has more surface tension, and in many cases causing the component to stand up on its end. This results in a quality defect.

Figure 6:
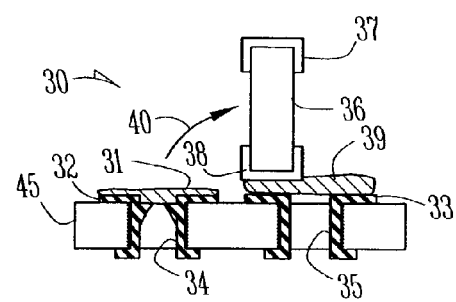
FIG. 6 shows a cross-sectional view of the prior art component-mounting region of FIG. 5, taken along line 29 of FIG. 5.

For example, in FIG. 6 solder layer 39 on pad 33 has greater surface tension than solder layer 31 on pad 32, causing terminal 37 to move in the direction indicated by arrow 40 and for component 36 to flip up on-end in a tombstone configuration.

Figure 7:
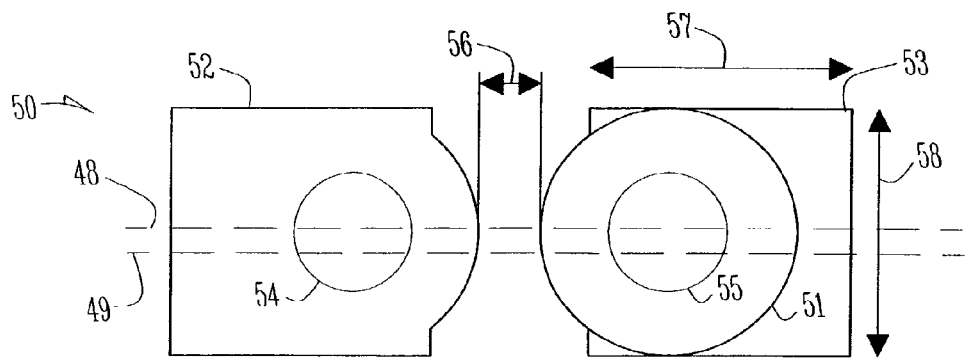
FIG. 7 shows a diagrammatic top view of a component-mounting region of a substrate, in accordance with one embodiment of the subject matter.

FIG. 7 shows a diagrammatic top view of a component-mounting region 50 of a substrate (not shown), in accordance with one embodiment of the subject matter. The component-mounting region 50 comprises component bonding pads 52 and 53, each of which has a respective via hole 54 and 55.

In the component-mounting region 50 shown in FIG. 7, vias 54 and 55 "intersect" or overlap with component bonding pads 52 and 53. This is seen more clearly regarding the right-hand side of component-mounting region 50, which shows a circular via pad 51 intersecting with a rectangular component bonding pad 53. This is referred to herein as a "Via Intersect Pad" (V-Int-Pad) stricture.

Component bonding pad 53 is outlined as a rectangular shape having a first dimension 57 and a second dimension 58. The rectangular shape of bonding pad 53 intersects with the essentially circular shape of via pad 51. In this example, via pad 51 has a diameter that is approximately the same as dimension 58 of bonding pad 53; however, the diameter (or other appropriate dimension, in the case of a non-circular via) of via pad 51 could be larger or smaller than dimension 58.

The "intersection" or overlap of the component bonding pad with the via pad is also seen on the left-hand side of component-mounting region 50, showing the merged outline of the bonding pad 52 and via 54. When this layout of component-mounting regions is proliferated over a large area of a PCB, it uses up substantially less PCB area than the prior art component-mounting region 1 shown in FIGS. 1 and 2, thus reducing the overall size, complexity, and cost of the PCB. In addition, as will be described in greater detail below, the layout of the present disclosure reduces or eliminates the quality defects inherent in the prior art component-mounting regions 20 and 30 shown in FIGS. 3–6, thus improving the reliability and electrical performance of the PCB.

In one embodiment, dimensions 57 and 58 are each 0.559 mm (22 mil), and the separation 56 between bonding pads 52 and 53 is in the range of 0.01 to 0.02 mm (0.4 to 0.8 mil), with 0.015 mm (0.6 mil) being currently preferred in mounting 0402 (i.e., 0.040"×0.020") passive components. However, embodiments of the subject matter are not intended to be limited to these dimensions, and any implementation that is made in accordance with the teachings of the disclosure is intended to be covered by the appended claims.

Figure 8:
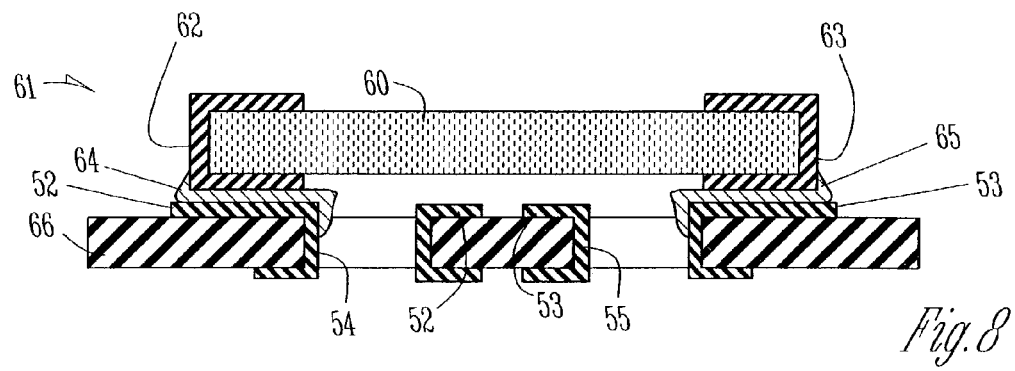
FIG. 8 shows a sectional view, taken between dashed lines 48 and 49 of FIG. 7, of a substrate having a component-mounting region that is similar to or identical to that shown in FIG. 7, and additionally shows a sectional view of a component coupled to the component-mounting region of the substrate.

FIG. 8 shows a sectional view, taken between dashed lines 48 and 49 of FIG. 7, of a substrate 66 bearing a component-mounting region 61 that is similar to or identical to that shown in FIG. 7, and additionally shows a sectional view of a component 60 coupled to the component-mounting region 61 of the substrate.

Component-mounting region 61 comprises layers 64 and 65 of solder on bonding pads 52 and 53, respectively. Bonding pads 52 and 53 have respective vias 54 and 55. In this example, vias 54 and 55 are shown as going entirely through substrate 66; however, in alternate embodiments either or both of vias 54 and 55 could go only partially through substrate 66.

Terminal 62 of component 60 is coupled to bonding pad 52 via solder layer 64. In this embodiment, terminal 62 is positioned so that substantially no portion of terminal 62 covers the opening of via 54. Likewise, terminal 63 of component 60 is coupled to bonding pad 53 via solder layer 65, and in this embodiment, terminal 63 is positioned so that substantially no portion of terminal 63 covers the opening of via 55.

The projection of a terminal of a component upon a bonding pad is referred to herein as a "bonding region". That is, a bonding region is that portion of the bonding pad to which the component terminal is affixed with an adhesive such as solder. For example, the projection of terminal 62 or 63 of component 60 upon bonding pad 52 or 53, respectively, constitutes a bonding region.

With the component-mounting arrangement shown in FIGS. 7 and 8, defects of the type mentioned above regarding the prior art VIP component-mounting structures shown in FIGS. 3–6 are virtually eliminated. At the same time, routing and bonding pad areas on the PCB are conserved, and it is unnecessary to utilize very small, expensive-to-make via sizes. By moving the vias inboard, i.e. inwardly under the component, away from the bonding regions where the component terminals will join their respective bonding pads, the "puddle" effect does not occur, because the via holes are not positioned beneath the solder fillets that are needed to connect the component terminals with their corresponding bonding pads. As mentioned above, the puddle effect occurs when solder flows to an area lower than the bonding pad on reflow, and this can result in insufficient solder in the solder joint between the bonding pad and the component terminal.

Figure 9:
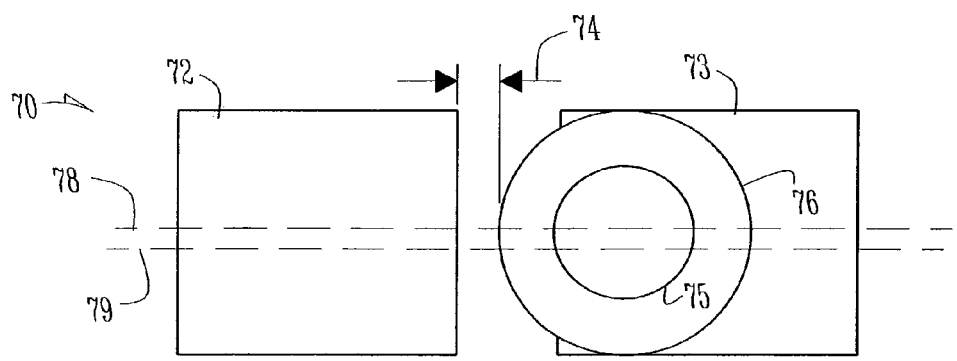
FIG. 9 shows a diagrammatic top view of a component-mounting region of a substrate, in accordance with another embodiment of the subject matter.

FIG. 9 shows a diagrammatic top view of a component-mounting region 70 of a substrate (not shown), in accordance with another embodiment of the subject matter. In this embodiment, the V-Int-P structure on the right-hand side is similar to or identical to that shown on the right-hand side in FIG. 7. It includes a bonding pad 73 that is merged with an intersecting via pad 76 having a via hole 75. On the left-hand side of FIG. 9, the component-mounting region comprises a bonding pad 72 without any intersecting via pad such as via pad 76 on the right-hand side of FIG. 9. However, bonding pad 72 could be coupled via a trace to a non-intersecting via pad (not shown) of the type illustrated in FIG. 1

The spacing dimension 74 between bonding pads 72 and 73 can be slightly smaller than dimension 56 in FIG. 7, because it is unnecessary to account for two via widths between the terminals of the component, and the only significant remaining concern is providing sufficient space between pads 72 and 73 to avoid shorting. By reducing dimension 74, as compared with dimension 56 in FIG. 7, via 75 can be moved even further inwardly away from the solder fillet that forms beneath terminal 83 during reflow.

Figure 10:
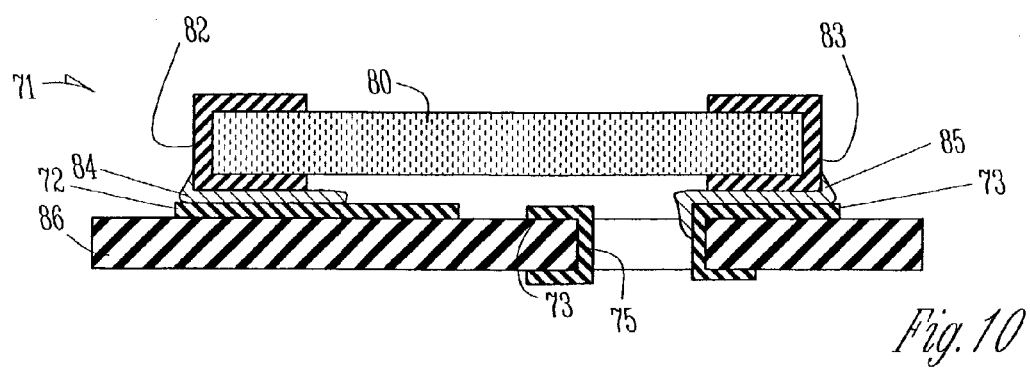
FIG. 10 shows a sectional view of the substrate shown in FIG. 9 taken between dashed lines 78 and 79 of FIG. 9, and additionally shows a sectional view of a component coupled to the component-mounting region of the substrate.

FIG. 10 shows a sectional view of the substrate shown in FIG. 9 taken between dashed lines 78 and 79 of FIG. 9, and additionally shows a sectional view of a component 80 coupled to the component-mounting region 71 of the substrate.

Component-mounting region 71 comprises layers 84 and 85 of solder on bonding pads 72 and 73, respectively. Bonding pad 73 has a via 75, but bonding pad 72 does not have a via. In this example, via 75 is shown as going entirely through substrate 86; however, in alternate embodiments via 75 could go only partially through substrate 86.

Terminal 83 of component 80 is coupled to bonding pad 73 via solder layer 85. In this embodiment, terminal 83 is positioned so that substantially no portion of terminal 83 covers the opening of via 75. Terminal 82 of component 80 is coupled to bonding pad 72 via solder layer 84, and in this embodiment, terminal 82 can be positioned at any convenient location on bonding pad 72, because bonding pad 72 contains no via corresponding to via 75 of bonding pad 73.

With the component-mounting arrangement shown in FIGS. 9 and 10, defects of the type mentioned above regarding the prior art component-mounting structures shown in FIGS. 1–6 are virtually eliminated. At the same time, routing and bonding pad areas on the PCB are conserved, and it is unnecessary to utilize very small, expensive-to-make via sizes.

FIG. 11 shows a sectional view of an electronic assembly 100 including an IC package 102 coupled to a substrate 107, and additionally shows a sectional view of a component 110 coupled to a component-mounting region, in accordance with an embodiment of the subject matter.

IC package 102 comprises a plurality (only two of which are illustrated) of bumps 104, which are coupled to electrical traces within IC package 102. Bumps 104 of IC package 102 are physically and electrically coupled to corresponding bonding pads or lands 105 on a surface of a substrate 107, such as a PCB, by way of contacts, bumps, or balls 106, each comprising an electrically conductive material such as solder. Solder balls 106 are of approximately the same shape, size, and pitch as bumps 104 and lands 105. Lands 105 can comprise vias 108; however, in alternate embodiments some or all of lands 105 do not include vias.

Component 110 comprises a pair of terminals 112 and 113 coupled to lands 114 and 115, respectively, by way of corresponding solder layers 116 and 117. While the component-mounting region 100 illustrated in FIG. 11 is depicted as similar to or substantially identical to that illustrated in FIGS. 7 and 8, it could also be implemented with a component-mounting region that is similar to or substantially identical to that illustrated in FIGS. 9 and 10.

PCB 107, IC package 102, and component 110 form an electronic assembly that can be part of an electronic system.

FIG. 12 shows a diagrammatic top view of a component-mounting region 120 of a substrate (not shown), including a portion of a component 94 coupled to a bonding pad 90 of the component-mounting region 120, and additionally illustrates how a via hole 92 can be positioned at alternative locations within the via pad 91, in accordance with embodiments of the subject matter. Component 94 can be similar to or substantially identical to component 60 in FIGS. 7 and 8. Likewise, bonding pad 90 can be similar to or substantially identical to bonding pad 53 in FIGS. 7 and 8.

Bonding pad 90 intersects with via pad 91, which in this embodiment has a diameter that is substantially the same as the width (i.e. dimension 58 in FIG. 7) of bonding pad 90. Via pad 91 comprises a via hole 92. Via hole 92 can be partially seen from this top view, and the remainder of via hole 92 lies beneath component 94 and is shown in dashed outline.

It will be seen that in this embodiment via hole 92 is not concentric with via pad 91. Via pad 91 can comprise a via hole that is located anywhere within the perimeter of via pad 91; however, the via hole of via pad 91 is optimally located to the in-board side, or left, of the inner edge 96 of terminal 95 of component 94, as viewed in FIG. 12.

Also shown in FIG. 12 is an alternate location of a via hole 93 shown entirely in dashed outline. Via hole 93 merely shows one example of an alternate location for a via hole within via pad 91, as the via hole can be located anywhere within the via pad.

In addition to having a great deal of flexibility in the location of the via hole within the via pad, it will be seen from the following discussion of FIG. 13 that the intersection of the via pad with the bonding pad can be such that the bonding pad need not confine the via hole within the perimeter of the bonding pad.

FIG. 13 shows a diagrammatic top view of a component-mounting region 130 of a substrate (not shown), including a portion of a component 136 coupled to the bonding pad 132 of the component-mounting region, and additionally illustrates how a via pad 134 can be positioned at an alternative location while still intersecting with the bonding pad 132, in accordance with an embodiment of the subject matter.

In this example, via pad 134 is shown having a concentric via hole 138; however, via hole 138 could be located off-center within via pad 134 as in the examples shown in FIG. 12.

Via pad 134 is located such that it intersects with bonding pad 132, i.e. the perimeter of via pad 134 intersects with that of bonding pad 132. However, only a small portion of via pad 134 intersects with bonding pad 132 in this embodiment, unlike the embodiments shown in FIGS. 7–10, wherein substantially all of the via pad lies within the perimeter of the bonding pad. In other embodiments, the intersection of the via pad with the bonding pad can range from 1% to 99%, depending upon the particular design requirements and where the solder fillet will form.

Further, while the embodiments illustrated thus far all show the via hole (i.e. via hole 138, FIG. 13) inside the perimeter of the bonding pad (e.g. bonding pad 132), in other embodiments, the via hole could be located outside of the perimeter of the bonding pad, provided only that the via pad (e.g. via pad 134, FIG. 13) intersects with the bonding pad perimeter.

Via pad 134 can intersect anywhere along the perimeter of bonding pad 132. While the via hole 138 of via pad 134 is optimally located to the in-board side, or left side (as viewed in FIG. 13), of the inner edge 139 of terminal 140 of component 136, in other embodiments the via pad could intersect with the bonding pad perimeter at a point that is substantially in vertical alignment with a component terminal, or even out-board of the component terminal, as will now be discussed regarding FIG. 14.

FIG. 14 shows a diagrammatic top view of a component-mounting region 150 of a substrate (not shown), including a portion of a component 156 coupled to bonding pad 158 of component-mounting region 150, and additionally illustrates how a via pad 160 can be positioned at alternative locations while still intersecting with the bonding pad 158, in accordance with other embodiments of the subject matter.

In one such embodiment, via pad 160 is shown to be located "out-board" of the component terminal 152. Via pad 160 intersects with the perimeter of bonding pad 158. Via hole 162 is concentric with via pad 160 and is located outside the perimeter of bonding pad 158; however, via hole 162 could be located within the perimeter of bonding pad 158, and/or it could be located off-center within via pad 160.

In another such embodiment, shown in dashed outline in FIG. 14, via pad 160 is shown to be located substantially in vertical alignment (as viewed in FIG. 14) with terminal 152 of component 156. In this geometry, via pad 160 is neither "in-board" nor "out-board" of the component terminal 152, but in a location adjacent edge 154 of terminal 152 it is said to be "offset" from the component terminal 152. In yet another embodiment (not shown), via pad 160 could be located offset on the opposite side of terminal 152 along edge 164.

Although the intersection of the via pad with the bonding pad is optimally in-board of the component terminal, and substantially within the projection or "footprint" of the component on the substrate, in order to minimize the impact of the component's footprint and mounting structure upon the substrate real estate, sometimes it may be necessary to locate the via pad out-board or offset from the component terminal in order to accommodate a specific trace routing. This can occur, for example, if a trace must be routed between the bonding pads (e.g. bonding pads 52 and 53, FIG. 7), or if a trace must be routed very close to the bottom or top edges of either or both of the pair of bonding pads (e.g. bonding pads 52 and 53, as viewed in FIG. 7).

Referring back to FIG. 11, the electrical component in the IC package 102 that is mounted to PCB 107 can be of any type, such as a microprocessor or microcontroller, memory circuit, application specific integrated circuit (ASIC), digital signal processor (DSP), a radio frequency circuit, an amplifier, a power converter, a filter, a clocking circuit, and the like.

The component 110 that is mounted to PCB 107 can be any type of component. In one embodiment, it is a passive surface-mount technology (SMT) element such as an inductor, capacitor, or resistor; however, it could be any other kind of electrical or electronic device, such as a coil, fuse, small-outline transistor, plastic-leaded chip carrier, ceramic chip carrier, small-outline IC, small-outline J-lead package, dual in-line package, gull-wing package, or the like.

In one embodiment, the present subject matter is used, for example, with small SMT passive components referred to as "0402", i.e. 0.040"×0.020". It can also be used with smaller SMT passive components, such as 0201's (0.020"×0.010"). It can also be used with larger SMT passive components, such as 0603's (0.060"×0.030") and 1210's (0.120"×0.100"). These component sizes are merely representative and are not intended to be limiting.

While components having only two terminals have been shown and described, embodiments of the subject matter are not limited to components having only two terminals. Many types of components, including passive components, can comprise more than two terminals, and the precepts of the subject matter can readily be extended to component-mounting regions that will accommodate such components. For example, embodiments of the subject matter can be used to mount quad flat-packs, dual in-line packages, gull-wing packages, 0402 arrays (i.e. two or more 0402 components coupled together), and so forth.

Figure 15:
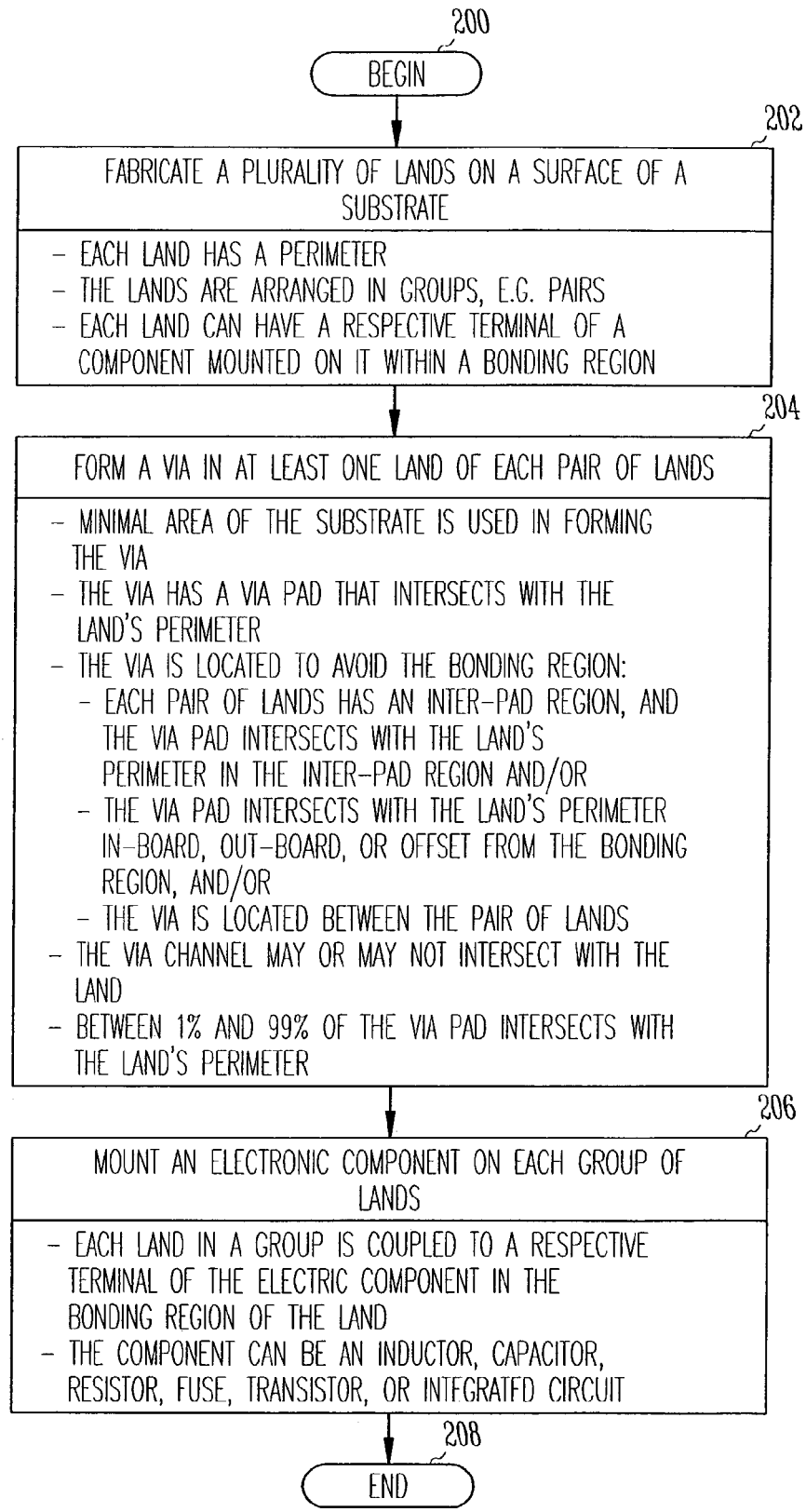
FIG. 15 is a flow diagram of a method of fabricating an electronic assembly, in accordance with one embodiment of the subject matter.

FIG. 15 is a flow diagram of a method of fabricating an electronic assembly, in accordance with one embodiment of the subject matter. The method begins at 200.

In 202, a plurality of lands are fabricated on a surface of a substrate, such as a PCB. Each land has a perimeter. The lands are arranged in groups, generally one group per component to be mounted upon the substrate. The number of lands per group depends upon the number of terminals per component. For passive components, such as capacitors, having two terminals, each group comprises a pair of lands. Each land can have a respective terminal of a component mounted on it within a bonding region of the land.

In 204, a via is formed in at least one land of each group of lands (e.g. a pair of lands). In positioning and forming the via, minimal area of the substrate is used. The via has a via pad that intersects with the land's perimeter. The via is located so as to avoid the bonding region. This can be accomplished conceptually in different ways: (1) each group or pair of lands has an "inter-pad region"(i.e., the region underlying the component), and the via pad intersects with the land's perimeter in the inter-pad region; and/or (2) the via pad intersects with the land's perimeter in-board of, out-board of, or offset from the bonding region (as described above regarding FIGS. 12 and 14); and/or (3) the via is located between the pairs of lands (in the case where the number of lands per group is two). The via channel or hole may (as in FIG. 7) or may not (as in FIG. 14) intersect with the land. A range of anywhere between 1% and 99% of the via pad can intersect with the land's perimeter. The vias can be plugged or capped on their back sides, if desired, by any suitable via-capping material, such as an organic material that is curable by the application of heat and/or ultraviolet light. The percentage of the via that is capped can range between 1% and 100%. In addition, the exposed metal surfaces of the PCB can be coated, if desired, with a suitable coating for protection until the PCB is ready for solder reflow.

In 206, an electronic component is mounted on each group of lands. Each land in a group is coupled to a respective terminal of the electronic component. The coupling occurs in the bonding region of the land. The component can be of any type, such as an inductor, capacitor, resistor, fuse, transistor, or integrated circuit. The method ends at 208.

The operations described above with respect to FIG. 15 could be performed in a different order from those described herein.

CONCLUSION

Embodiments of the present subject matter provide significantly improved reliability of the solder connections between the electrical contacts of electronic components, such as SMT passive components, and corresponding via-intersect-pad (V-Int-P) type lands on substrates, e.g., printed circuit boards.

By forming the intersection of the via pad and its associated bonding pad such that the via hole does not overlap with the bonding region, with which the component terminal makes contact and is bonded to the bonding pad, solder does not run down or puddle in the via hole during solder reflow. This solves several significant manufacturing defect problems, while allowing PCB real estate and PCB fabrication costs to be kept to a minimum. This has the overall effect of providing stronger solder connections between the component and the PCB substrate, thus ensuring greater reliability of the electronic assembly and of any electronic system incorporating such electronic assembly.

As shown herein, the present subject matter can be implemented in a number of different embodiments, including a method for fabricating a substrate, a method for fabricating an electronic assembly, a substrate, an electronic assembly, and an electronic system. Other embodiments will be readily apparent to those of ordinary skill in the art. The elements, compositions, geometry, architecture, dimensions, and sequence of operations can all be varied to suit particular product and packaging requirements.

The various elements depicted in the drawings are merely representational and are not drawn to scale. Certain proportions thereof may be exaggerated, while others may be minimized. The drawings are intended to illustrate various implementations of the subject matter, which can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present subject matter. Therefore, it is manifestly intended that embodiments of this disclosure be limited only by the claims and the equivalents thereof.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. A method comprising:
    fabricating a plurality of lands on a substrate surface, each land having a perimeter, the lands being arranged in groups, each land in a group to have a respective terminal of a component mounted on a bonding region thereof; and
    forming a via in at least one land of each group, the via having a via pad that intersects with the at least one land's perimeter, wherein the via is not positioned out-board of the bonding region, and wherein the via does not intersect with the bonding region.

2. The method recited in claim 1, wherein the group of lands has an inter-pad region, and wherein the via pad intersects with the at least one land's perimeter in the inter-pad region.

3. The method recited in claim 1, wherein the group of lands consists of two lands, and wherein the via pad intersects with the at least one land's perimeter in-board of the bonding region.

4. The method recited in claim 1, wherein the via does not intersect with the at least one land.

5. The method recited in claim 1, wherein a range of 1% to 99% of the via pad intersects with the at least one land's perimeter.

6. A method comprising:
    fabricating a plurality of pairs of lands on a substrate surface, each land having a perimeter, each land in a pair of lands to have a respective terminal of a component mounted thereon within a bonding region; and
    forming a via in at least one land of each pair of lands, the via having a via pad that intersects with the at least one land's perimeter, the via being located between the bonding regions of the lands of a pair of lands.

7. The method recited in claim 6, wherein each pair of lands has an inter-pad region, and wherein the via pad intersects with the at least one land's perimeter in the inter-pad region.

8. The method recited in claim 6, wherein the via pad intersects with the at least one land's perimeter in-board of the bonding region.

9. The method recited in claim 6, wherein the via pad intersects with the at least one land's perimeter, and wherein the via is not positioned out-board of the bonding region.

10. The method recited in claim 6, wherein the via pad intersects with the at least one land's perimeter, and wherein the via is not concentric with the via pad.

11. The method recited in claim 6, wherein the via does not intersect with the at least one land.

12. The method recited in claim 6, wherein between 1% and 99% of the via pad intersects with the at least one land's perimeter.

13. The method recited in claim 6 wherein, in the forming operation, minimal area of the substrate surface is used.

14. The method recited in claim 6, wherein the via is located between the pair of lands.

15. A method comprising:
    fabricating a plurality of lands on a substrate surface, each land having a perimeter, the lands being arranged in groups;
    forming a via in at least one land of each group, the via having a via pad that intersects with the at least one land's perimeter; and
    mounting an electronic component on each group of lands, each land in a group being coupled to a respective terminal of the electronic component in a bonding region of the land,
    wherein the via is formed between the bonding regions of the lands of a group.

16. The method recited in claim 15, wherein the via does not intersect with the bonding region of the at least one land.

17. The method recited in claim 15, wherein a selected group of lands has an inter-pad region, and wherein the via pad intersects with the at least one land's perimeter in the inter-pad region.

18. The method recited in claim 15, wherein the group of lands consists of two lands, and wherein the via pad intersects with the at least one land's perimeter in-board of the bonding region.

19. The method recited in claim 15, wherein a range of 1% to 99% of the via pad intersects with the at least one land's perimeter.

20. The method recited in claim 15, wherein the electronic component is selected from the group consisting of an inductor, capacitor, resistor, fuse, transistor, and integrated circuit.

21. The method recited in claim 15, wherein the via is positioned beneath the electronic component.

22. A method comprising:
    fabricating a group of lands on a substrate surface to have respective terminals of an electronic component mounted thereon in respective bonding regions of the lands; and
    forming a via in at least one land of the group, wherein the via is positioned substantially beneath the projection of the electronic component upon the substrate surface, and wherein the via does not intersect with the bonding region of the at least one land.

23. The method recited in claim 22, wherein the via is positioned entirely beneath the projection of the electronic component upon the substrate surface.

24. The method recited in claim 22, wherein the at least one land has a perimeter, and wherein the via has a via pad that intersects with between 1% and 99% of the at least one land's perimeter.

25. The method recited in claim 22, wherein the at least one land has a perimeter, and wherein the via has a via pad that intersects with the at least one land's perimeter.

26. The method recited in claim 25, wherein the group of lands has an inter-pad region, and wherein the via pad intersects with the at least one land's perimeter in the inter-pad region.

27. The method recited in claim 22, wherein the group of lands has an inter-pad region, and wherein the via is in the inter-pad region.

* * * * *